US012610787B2

(12) United States Patent
Shih et al.

(10) Patent No.:     US 12,610,787 B2
(45) Date of Patent:       Apr. 21, 2026

(54) ASYMMETRIC PADS STRUCTURE AND TEST ELEMENT GROUP MODULE

(71) Applicant: Nanya Technology Corporation, New Taipei City (TW)

(72) Inventors: Chiang-Lin Shih, New Taipei City (TW); Meng-Zhen Li, New Taipei City (TW); Wei-Ming Liao, Taoyuan City (TW); Hsueh Han Lu, New Taipei City (TW); Wei Zhong Li, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 380 days.

(21) Appl. No.: 18/211,813

(22) Filed: Jun. 20, 2023

(65) Prior Publication Data

US 2024/0429109 A1      Dec. 26, 2024

(51) Int. Cl.
H10P 74/00         (2026.01)
(52) U.S. Cl.
CPC .......... H10P 74/273 (2026.01); H10P 74/277 (2026.01)

(58) Field of Classification Search
CPC ............................... H01L 22/32; H01L 22/34
See application file for complete search history.

(56) References Cited

U.S. PATENT DOCUMENTS

| | | | |
|---|---|---|---|
| 10,615,087 B2* | 4/2020 | Liao ...................... H01L 23/562 |
| 12,293,247 B2* | 5/2025 | Henes Neto ....... G06K 7/10356 |
| 2020/0411383 A1* | 12/2020 | Tsuboi ................. H10D 86/201 |
| 2023/0187289 A1* | 6/2023 | Momota ................. H01L 22/34 |
| | | | 257/48 |

* cited by examiner

*Primary Examiner* — Marlon T Fletcher
*Assistant Examiner* — Kimberly Newman Frey
(74) *Attorney, Agent, or Firm* — Birch, Stewart, Kolasch & Birch, LLP

(57)                    ABSTRACT

This invention provides an asymmetric pads structure using at a scribe line of a wafer, comprising a test element device electrically connected to a first pad and a second pad separately, wherein a first spacing between the second pad and the test element device is sufficient to accommodate the second pad of an another asymmetric pads structure. So, two neighboring asymmetric pads structures may cross to each other to form a cross configuration.

6 Claims, 4 Drawing Sheets

ASYMMETRIC PADS STRUCTURE AND TEST ELEMENT GROUP MODULE

BACKGROUND OF THE INVENTION

Field of the Invention

The present invention relates to a testing structure, referring to an asymmetric pads structure configured within scribe lines of a wafer.

Description of the Prior Art

In the development of nanoscale processes of semiconductor technology over the years, many significant breakthroughs have achieved. Referring to FIG. 1. The trend of this technology is to shrink a chip size and a width of scribe lines defining a frame of a wafer where a die is located, aiming to obtain more effective dies on a wafer. The development of nanoscale process technology aims to achieve higher integrated circuit density and performance to meet the demands of modern electronic products for smaller, faster, and more energy-efficient devices.

Continuous process monitoring is required during a semiconductor process to maintain and assure device quality. Specifically, the alignment of a probe card with TEG (Test Element Group)/PAD configurations on the wafer is required. This typically involves positioning the probe card such that the test probes on it align with the pads of the TEG/PAD configurations on the wafer. Once the probe card aligned, the test probes on the probe card make contact with the pads. These test probes are typically small and flexible metal needles that provide electrical or test signal connections upon contact. Once the test probes on the probe card make contact with the pads, the test system delivers test signals to the TEG on the wafer through the probe card. These signals may involve voltage, current, timing, or other specific test conditions to test the components on the wafer. The test system monitors and records the test results obtained from the TEG. These results may reflect electrical characteristics of the components, functional operations of the components, and other relevant test data.

Please refer to FIG. 2. A conventional TEG module is typically set up within an area between two crack stop lines, the area is narrower than the scribe line (S/L) for wafer dicing. The TEG module is constituted by a plurality of symmetric TEG/PAD configurations each of which configured by two pads (PAD1 and PAD2) and a test element (T). The two pads (PAD1 and PAD2) are electrically connected to left and right ends of the test element (T) separately as input and output connections. There is a pitch (PITCH 0) between the pads (PAD1 and PAD2), and the pitch (PITCH 0) corresponds a pitch between each two neighboring test probes on the probe card for aligning the pads and the test probes. As the nanoscale process develops, chip size and the width of scribe lines (S/L) are shrank on new products to gain more effective dies on a wafer, and there are more and more request for quality of process monitoring, more area for accommodating more test element groups (TEG) is needed to gain more counts of the TEG module. The scribe line narrows down will not fit the need.

It is desirable to propose a testing structure, which allows more TEGs occupy within the scribe line when the scribe line narrows down to gain more counts of TEG module.

SUMMARY OF THE INVENTION

The present invention provides an asymmetric pads structure using at a scribe line of a wafer, which comprises a test element device electrically connected to a first pad and a second pad separately, a first spacing between the second pad and the test element device is sufficient to accommodate a second pad of an another asymmetric pads structure.

In an implementation of the present invention, the first spacing is larger than a second spacing between the first pad and the test element device.

In an implementation of the present invention, the asymmetric pads structure is configured to cross the another asymmetric pads structure.

In an implementation of the present invention, a pitch between the first pad and second pad of the asymmetric pads structure is same of the another asymmetric pads structure.

In an implementation of the present invention, the pitch is defined by a distance between center lines of the first pad and the second pad.

In an implementation of the present invention, the test element device is located between the first pad and second pad.

The present invention further provides a test element group module using at a scribe line of a wafer, which comprises a plurality of asymmetric pads structure. The plurality of asymmetric pads structure are paired and every paired asymmetric pads structures cross to each other. Each of the asymmetric pads structures has a test element device electrically connected to a first pad and a second pad separately and located in between. A first spacing between the test element device and one of the first pad and the second pad is sufficient to accommodate one of the first pad and the second pad, and a second spacing between the test element device and the other of the first pad and the second pad is closer to the test element device.

In an implementation of the present invention, a pitch of each of the asymmetric pads structures is same, and the pitch is defined by a distance between center lines of the first pad and the second pad.

In an implementation of the present invention, the test element group module is configured in one line array between crack stop lines located within the scribe line.

BRIEF DESCRIPTION OF THE DRAWINGS

The foregoing and other features and advantages of the example embodiments of the present invention will become more apparent upon consideration of certain example embodiments of the inventive concepts illustrated in the accompanying drawings. The drawings are not necessarily to scale, but emphasize certain features and principles of the example embodiments of the inventive concepts. Throughout the drawings and written description, like reference numbers and labels are used to denote like or similar elements and features. In the drawings.

DETAILED DESCRIPTION OF THE PREFERRED EMBODIMENTS

Figure 1:
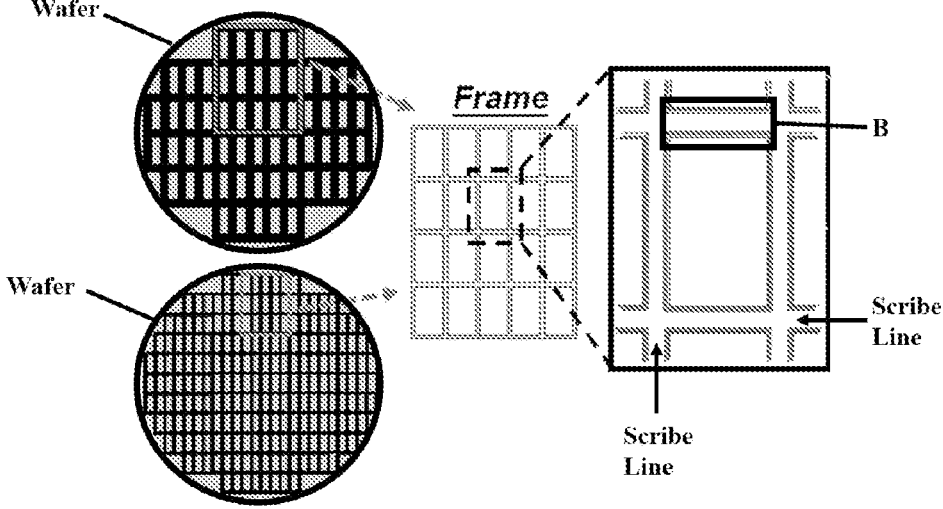
FIG. 1 is a simplified diagram relative to nanoscale processes of semiconductor technology of the prior art.

Hereinafter, exemplary embodiments of the present inventive concept will be described in detail with reference to the accompanying drawings. The exemplary embodiments of the present inventive concept are provided so that this disclosure will be thorough and complete, and will fully convey the present inventive concept to one of ordinary skill in the art. Since the inventive concept may have diverse modified embodiments, exemplary embodiments are illustrated in the drawings and are described in the detailed description of the inventive concept. However, this does not limit the present inventive concept within specific embodiments and it should be understood that the present inventive concept covers all the modifications, equivalents, and replacements within the idea and technical scope of the present inventive concept. Like reference numerals may refer to like elements throughout. In the drawings, the dimensions and size of each structure may be exaggerated, reduced, or schematically illustrated for convenience in description and clarity.

Terms like "first", "second" . . . etc. It may be used to describe various elements, but the elements should not be limited by the terms. The terms may be used only as purpose for distinguishing an element from another element.

It will be understood that, although the terms first, second, third, etc. may be used herein to describe various elements, components, regions and/or sections, these elements, components, regions and/or sections should not be limited by these terms. These terms are only used to distinguish one element, component, region or section from another element, component, region or section. Thus, a first element, component, region or section discussed below could be termed a second element, component, region or section without departing from the teachings of the example embodiments of the inventive concepts.

Figure 3:
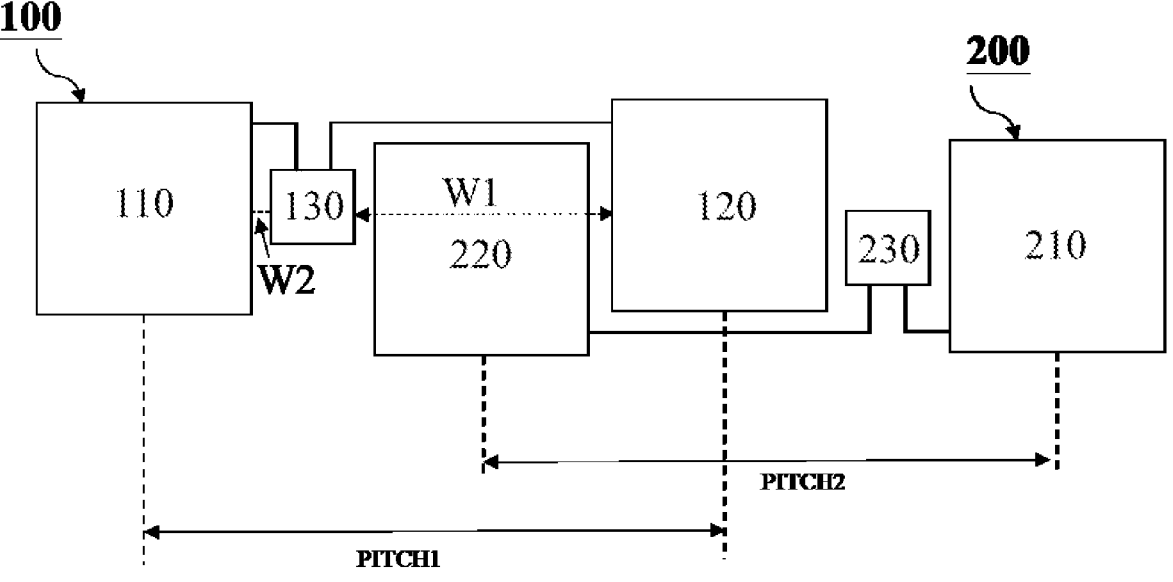
FIG. 3 is a schematic diagram showing a cross structure configured by a pair of asymmetric pads structure according to one example embodiment of the present invention.

Referring to FIG. 3. It describes a schematic diagram of a cross structure configured by a pair of an asymmetric pads structure according to one example embodiment of the present invention. The cross structure includes a first asymmetric pads structure 100 and a second asymmetric pads structure 200 cross to each other. The first asymmetric pads structure 100 has a first pad 110 as an input pad, a second pad 120 as an output pad, and a test element device 130 used to test whether semiconductor components on the wafer are functioning properly. The test element device 130 is located between the first pad 110 and the second pad 120, and it is electrically connected to the first pad 110 and the second pad 120 separately. A first spacing W1 exists between the second pad 120 and the test element device 130, and a second spacing W2 exists between the first pad 110 and the test element device 130. A distance between center lines of the first pad 110 and the second pad 120 defines a first pitch PITCH1. Similarly, a second asymmetric pads structure 200 has the same configuration, namely having a first pad 210, a second pad 220 and a test element device 230, as the first asymmetric pads structure 100. The first pitch PITCH1 between the first pad 110 and second pad 120 of the asymmetric pads structure 100 is same of a second pitch PITCH2 between the first pad 210 and second pad 220 of the second asymmetric pads structure 200. It ensures a homogeneous distribution of test probes of a probe card on the asymmetric pads structures 100, 200, and aligning the first pads 110, 210 and the second pads 120, 220. The term "pitch" is typically expressed in a unit of distance such as millimeters or micrometers and is determined based on testing requirements and process technology. A smaller pitch implies a tighter spacing between the first pad 110 and second pad 120, providing higher test coverage and more detailed testing capabilities. The specific value of the pitch will vary depending on factors such as component density on the wafer, testing requirements, and limitations of the testing equipment. During the design process of the Wafer Acceptance Test (WAT), test engineers or designers consider these factors to determine the appropriate pitch that achieves the testing goals and requirements.

As shown in the first asymmetric pads structure 100, the first spacing W1 is larger than the second spacing W2 to form an asymmetric structure, so that the first spacing W1 between the second pad 120 and the test element device 130 is sufficient to accommodate the second pad 220 of the second asymmetric pads structure 200. With this structure, the first asymmetric pads structure 100 can be configured to cross the second asymmetric pads structure 200 for enabling a compact and dense arrangement on same area within the scribe line.

Figure 4:
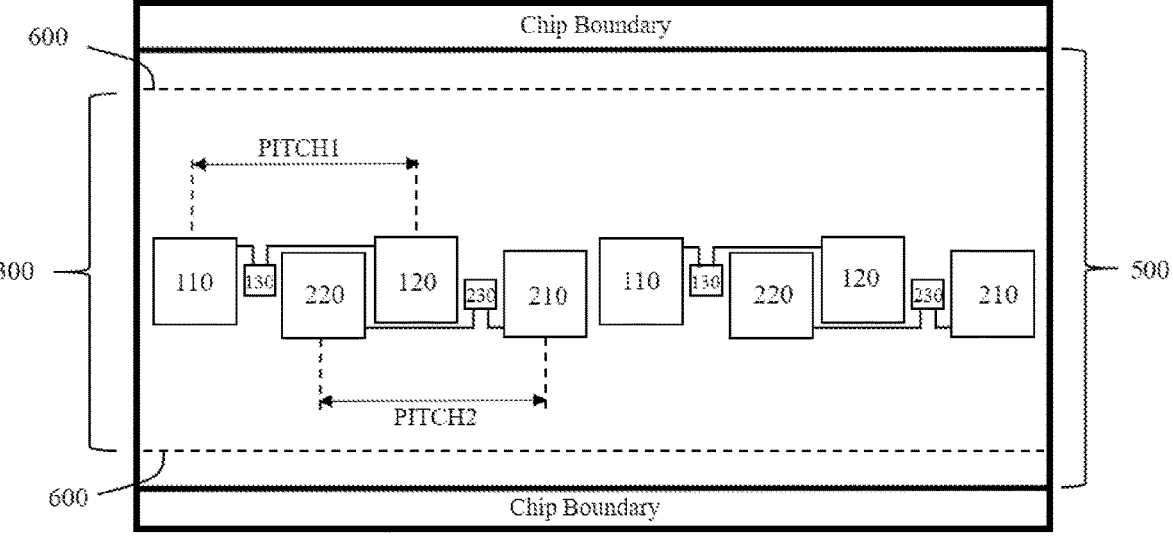
FIG. 4 is a simplified diagram of a test element group module within a scribe line according to one example embodiment of the present invention.

Referring to FIGS. 3 and 4. By leveraging this cross arrangement in which a plurality of asymmetric pads structure are paired, and crossing to each other for the every paired asymmetric pads structures, such as the first asymmetric pads structure 100 and the second asymmetric pads structure 200 in FIG. 3. The asymmetric pads structures 100, 200 may be layout in a linear array or in a row along each scribe line 500 to form a test element group module 300. More specifically, the test element group module 300 is typically configured between crack stop lines 600 located within the scribe line 500. This placement serves to isolate the test element group module 300 from other process regions, such as chip boundary, minimizing interference and conflicts. Additionally, the presence of crack stop lines 600 helps protect the integrity of the wafer, preventing damage or cracks during a dicing process of cutting the wafer into the chips. In the present invention, the test element group module 300 is determined by design engineers during the wafer design phase based on testing requirements and objectives, as well as the component layout and structures on the wafer. This involves determining the position, quantity, spacing, and interconnections of the test element group, such as test element devices 130, 230 and more.

Figure 2:
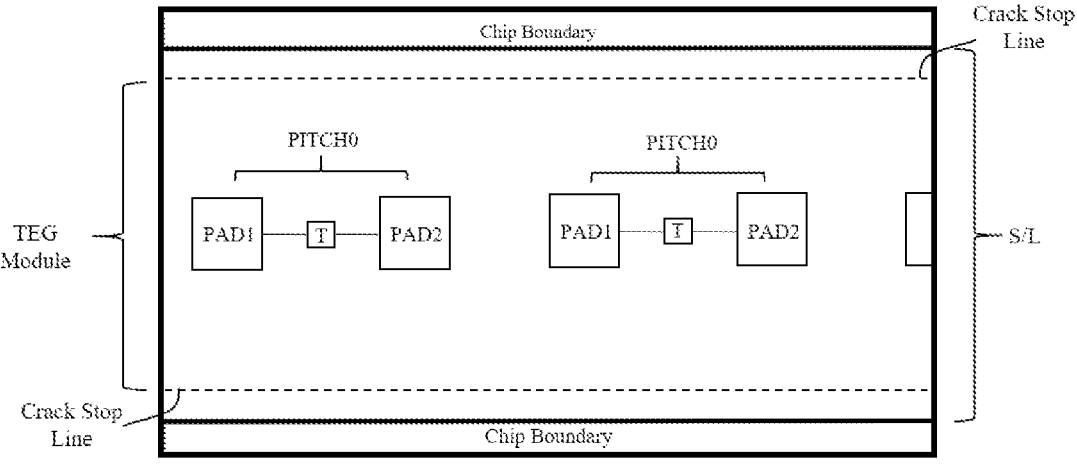
FIG. 2 is an enlarged diagram of a part of a conventional TEG model occupying within a part B of a scribe line of FIG. 1.

The asymmetric pads structures 100, 200 allow for a higher quantity of the asymmetric pads structures accommodated on the wafer when the scribe line 500 narrows down compared to the conventional symmetric pad structure shown in FIG. 2. Also, each paired and crossing asymmetric pads structures can be arranged in a compact manner with another paired and crossing asymmetric pads structure, thereby improving testing efficiency and overall productivity within the limited space of the scribe lines 500 of a wafer. Additionally, the pitch of the test element group module 300 of the present invention may be designed same as the conventional symmetric pads structure shown in FIG. 3 to keep the pitch of a conventional wafer acceptance test (WAT) pad, so the present test element group module 300 is adaptable to a conventional probe card. The high-density configuration of the present test element group module 300 and its optimized design contribute to improved quality control, enhanced product reliability, and increased manufacturing efficiency. Therefore, the present invention provides new possibilities for the semiconductor industry, empowering manufacturers with advanced testing capabilities and paving the way for technological advancements in the field.

The above-mentioned embodiments of the present invention are exemplary and not intended to limit the scope of the present invention. Various variation or modifications made without departing from the spirit of the present invention and achieving equivalent effects shall fall within the scope of claims of the present invention.

What is claimed is:

1. An asymmetric pads structure using at a scribe line of a wafer, comprising:

a test element device, electrically connected to a first pad and a second pad separately;

wherein a first spacing between the second pad and the test element device is sufficient to accommodate a second pad of an another asymmetric pads structure which is a counterpart of the asymmetric pads structure, and wherein the asymmetric pads structure and the another asymmetric pads structure are arranged in a way that the second pad of the asymmetric pads structure and the test element device of the another asymmetric pads structure are positioned between a first pad of the another asymmetric pads structure and the second pad of the another asymmetric pads structure.

2. The asymmetric pads structure of claim 1, wherein the first spacing is larger than a second spacing between the first pad and the test element device.

3. The asymmetric pads structure of claim 1, wherein the asymmetric pads structure is configured to cross the another asymmetric pads structure.

4. The asymmetric pads structure of claim 1, wherein a pitch between the first pad and second pad of the asymmetric pads structure is same of the another asymmetric pads structure.

5. The asymmetric pads structure of claim 4, wherein the pitch is defined by a distance between center lines of the first pad and the second pad.

6. The asymmetric pads structure of claim 1, wherein the test element device is located between the first pad and second pad.

* * * * *